United States Patent [19]

Michael

[11] Patent Number: 4,603,405

[45] Date of Patent: Jul. 29, 1986

[54] MONOLITHICALLY INTEGRATED SEMICONDUCTOR CIRCUIT

[75] Inventor: Ewald Michael, Haar, Fed. Rep. of Germany

[73] Assignee: Siemens Aktiengesellschaft, Berlin and Munich, Fed. Rep. of Germany

[21] Appl. No.: 524,881

[22] Filed: Aug. 19, 1983

[30] Foreign Application Priority Data

Aug. 30, 1982 [DE] Fed. Rep. of Germany ....... 3232215

[51] Int. Cl.$^4$ ................................................ G11C 7/00
[52] U.S. Cl. ..................................... 365/201; 365/230
[58] Field of Search ....................... 365/201, 230, 200; 371/21

[56] References Cited

U.S. PATENT DOCUMENTS 3,420,991  1/1969  Ling ..................................... 371/21

Primary Examiner—Joseph A. Popek
Attorney, Agent, or Firm—Herbert L. Lerner; Laurence A. Greenberg

[57] ABSTRACT

A monolithically integrated digital semiconductor circuit includes an address decoder, inputs connected to the address decoder for supplying external addressing signals thereto, a test decoder connected to the address decoder and connected to the external addressing signal supply inputs for directly receiving at least part of the external addressing signals, circuit parts to be addressed being connected to and controlled by the test decoder, a switch-over section connected to the test decoder for supplying a specific switch-over signal thereto causing the test decoder to be activated and causing the address decoder to be placed in a rest condition.

18 Claims, 8 Drawing Figures

MONOLITHICALLY INTEGRATED SEMICONDUCTOR CIRCUIT

The invention relates to a monolithically integrated digital semiconductor circuit which is provided with an address decoder that can be addressed by external addressing signals and serves for controlling a part of the digital semiconductor circuit to be addressed. The invention preferably involves an integrated semiconductor memory matrix which is provided with a row address decoder as well as with a column address decoder.

As in other monolithically integrated semiconductor circuits, a functional test is indicated in the case of such a circuit after it is fabricated. Simpler integrated circuits can be tested functionally, for instance, by setting in all possible combinations of the inputs and internal states, to which certain output states must then correspond. For complex circuits, on the other hand, an optimal cost saving compromise must be found between the completeness of the test and the probability that a defective IC chip is built into equipment. Besides a purely functional test, a continuous production control in addition includes measurements of different technological and electrical parameters by means of test circuits on the IC chip.

It is accordingly an object of the invention to provide a monolithically integrated semiconductor circuit, which overcomes the hereinafore-mentioned disadvantages of the heretofore-known devices of this general type, and which assures a considerable increase in the certainty of detection of chips with defective circuits, with little additional cost.

With the foregoing and other objects in view there is provided, in accordance with the invention, a monolithically integrated digital semiconductor circuit, comprising an address decoder for controlling a part of the circuit to be addressed, inputs connected to the address decoder for supplying external addressing signals thereto, a test decoder leading to critical points of the integrated circuit or to test circuits monolithically combined therewith, the test decoder being connected to the address decoder and connected to the external addressing signal supply inputs for directly receiving at least part of the external addressing signals without intervention of the address decoder, circuit parts to be addressed being connected to and controlled by the test decoder, a switch-over section in the form of a switching circuit connected to the test decoder for supplying a specific switch-over signal thereto causing the test decoder to be activated and causing the address decoder to be placed in a rest condition.

Switching from normal operation of the integrated digital semiconductor circuit to the testing operation to be performed, by means of the test decoder can be triggered, for instance, by a switch-over signal which can be applied externally to a signal input of the integrated circuit which is especially provided for this purpose and the signal is then passed on to the switching part. On the other hand, however, it is also possible to generate the switching signal internally, by externally supplying the integrated circuit with a combination of input signals to the signal inputs also assigned to normal operation. This combination then activates an internal circuit part which then generates the switch-over signal and passes it on to the switch-over part in the integrated circuit. It is further possible to assign priority either to test operation or to normal operation of the integrated circuit according to the invention.

In accordance with another feature of the invention, there is provided an external terminal especially provided for feeding in the switch-over signal.

In accordance with a further feature of the invention, there are provided signal inputs not provided for driving the address decoder, the signal inputs being connected to the switch-over section for supplying a specific combination of digital input signals causing the switch-over section to generate the switch-over signal.

In accordance with an added feature of the invention, there is provided a supply voltage source, the test decoder and address decoder being formed of identical circuits, and the switch-over section being in the form of means for disconnecting the address decoder from the supply voltage source when the switch-over signal is supplied and for simultaneously connecting the test decoder to the supply voltage source.

In accordance with an additional feature of the invention, the test decoder is matched to the address decoder circuit-wise, in such a way that the address decoder is automatically deactivated when the test decoder is activated.

In accordance with again another feature of the invention, at least the test decoder and address decoder include self-blocking MOS field-effect transistors, preferably of the same channel type.

In accordance with again a further feature of the invention, there is provided a precharging pulse source, a trigger pulse source, a reference potential source and a supply potential source of the semiconductor circuit, which in particular is a RAM memory, the address decoder is in the form of a plurality of identical circuit sections, and each of the circuit sections includes a common node, first, second, third and fourth self-blocking MOS field-effect transistors, the fourth transistor having a gate terminal connected to one of the address inputs, a source terminal connected to the reference potential source and a drain terminal connected to the common node, the third transistor being connected between the common node and the supply potential source and having a gate terminal connected to the precharging pulse source, the second transistor being connected between the common node and the gate terminal of the first transistor and having a gate terminal connected to the supply potential source, the first transistor having a drain terminal connected to the trigger pulse source and a source terminal forming a signal output of the address decoder, and a capacitor connected between the gate terminal of the first transistor and the reference potential source.

In accordance with again an added feature of the invention, there are provided a plurality of inverters each being connected to a respective one of the address inputs for generating a signal at an inverted address input which is inverted relative to the addressing signal.

In accordance with again an additional feature of the invention, the test decoder includes a circuit node, fifth through twelfth self-blocking MOS field-effect transistors, the fifth transistor having a source terminal and the sixth transistor having a drain terminal together forming an output of the test decoder connected to the address decoder, the fifth transistor having a drain terminal connected to the trigger pulse source, the sixth transistor having a gate terminal connected to the precharging pulse source of the digital semiconductor circuit, which is in particular a dynamic RAM memory, and a source terminal connected to the reference potential source, and a capacitor connected between the gate terminal of the fifth transistor and the reference potential source, the twelfth transistor being connected between the gate terminal of the fifth transistor and the reference potential source and having a gate terminal connected to the precharging pulse source, the ninth and tenth transistors being connected together in series as a first pair of transistors connected between the gate terminal of the first transistor and the circuit node, the eleventh transistor being connected between the circuit node and the reference potential source and having a gate terminal connected to the precharging pulse source, the seventh and eighth transistors being connected together in series as a second pair of transistors connected between the circuit node and the supply potential source, the gate terminal of one of the transistors of each pair being connected to one of the address inputs and the gate terminal of the other of the transistors of each pair being connected to the inverted address input delivering a signal inverted relative to the one address input.

In accordance with yet another feature of the invention, the ninth transistor of the first pair is directly connected to the circuit node and the gate terminal thereof is connected to the one address input, and the eighth transistor of the second pair is directly connected to the circuit node and the gate thereof is connected to the inverted address input.

In accordance with yet a further feature of the invention, the test decoder includes a further part having thirteenth, fourteenth and fifteenth self-blocking MOS field-effect transistors, the thirteenth and fourteenth transistors having source-drain paths being connected together in series at a junction point, having gate terminals being connected to the junction point and having other terminals, the fifteenth transistor being connected between the junction point and the reference potential source and having a gate terminal connected to the precharging pulse source, the switch-over section being directly connected to the fifteenth transistor for supplying the switch-over signal thereto, and the other terminals each being connected to a respective one of the address input and inverted address input.

In accordance with yet an added feature of the invention, the circuit parts are test circuit parts, and the test decoder includes individual outputs for controlling activation of the test circuit parts provided in the circuit.

In accordance with yet an additional feature of the invention, the test decoder includes a common external test output, and the test circuit parts include signal outputs, and including transfer transistors each being connected between a respective one of the signal outputs of the test circuit parts and the common external test output and each having a gate terminal connected to a respective one of individual outputs of the test decoder.

In accordance with still another feature of the invention, the circuit is an addressable memory matrix having memory cells for normal operation thereof, and includes additional memory cells being exclusively addressable by the test decoder and having properties deviating from the normal memory cells, such as concerning the dimensions of the cells.

In accordance with a concomitant feature of the invention, there are provided means for selectively prioritizing or activating the operation with the address decoder or the test decoder.

Other features which are considered as characteristic for the invention are set forth in the appended claims.

Although the invention is illustrated and described herein as embodied in a monolithically integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
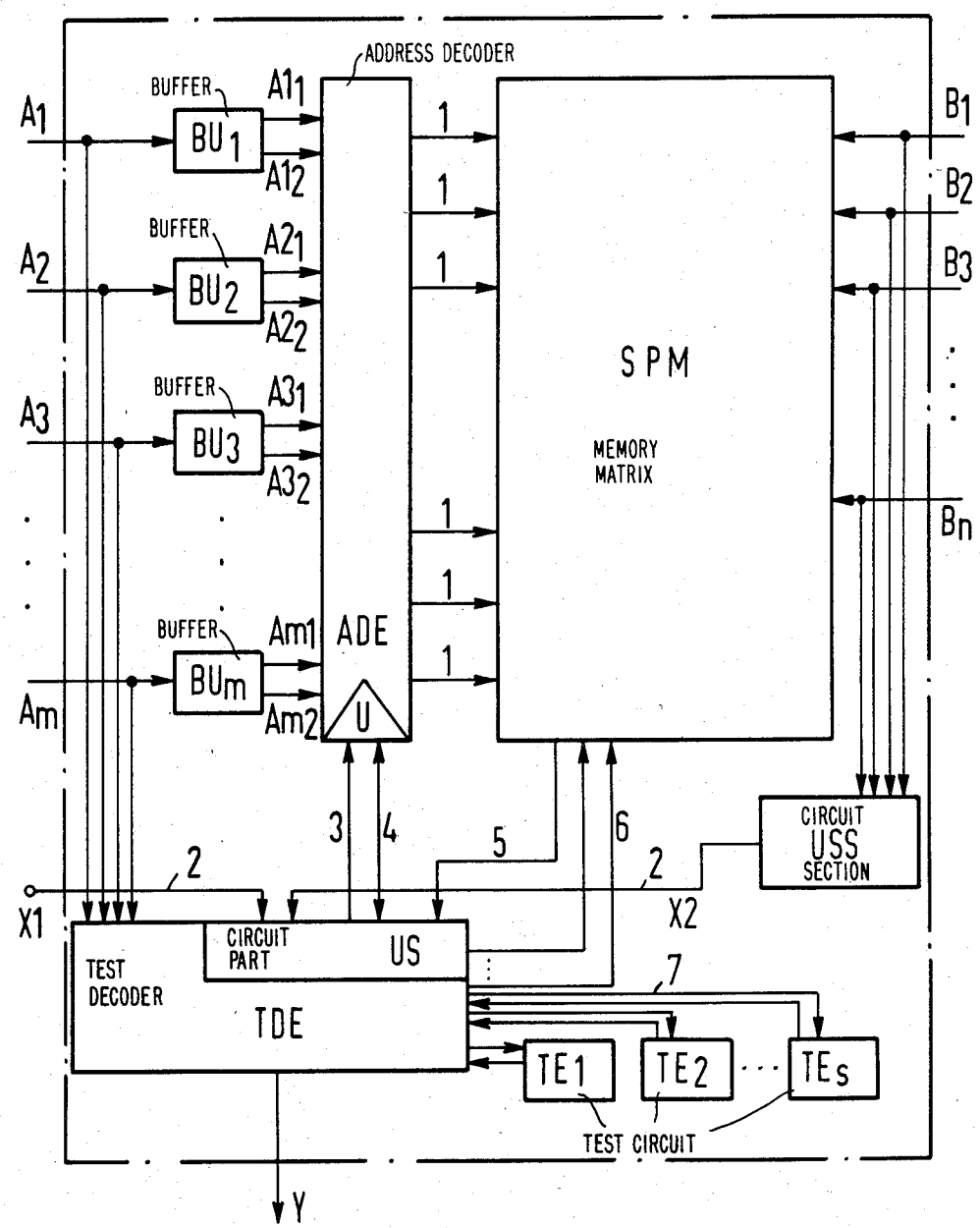
FIG. 1 is a block circuit diagram of a normal write-read memory which is supplemented by the various embodiments of the invention.

Referring now to the figures of the drawing in detail and first particularly to FIG. 1 thereof, there is seen an apparatus according to the invention for the simplified testing of memory modules. Reference symbol SPM refers to a memory matrix which is constructed in the conventional manner with addressing circuits and which can be addressed row-wise on one hand through an address decoder ADE as well as column-wise on the other hand. For this purpose, the memory matrix is connected to decoding outputs 1 of the address decoder ADE. On the other hand, the matrix SPM is provided with a number of external control inputs $B_1, B_2 \ldots B_n$ which serve for the respective external feeding and delivery of data to be stored and read out by the memory matrix SPM, and which are likewise constructed in the usual manner and connected to the matrix SPM. External addressing inputs $A_1, A_2, \ldots A_m$ are each connected to the address decoder ADE through a respective buffer circuit $BU_1, BU_2 \ldots BU_m$.

A test decoder TDE and a switch-over part US according to the invention, are present in the integrated circuit. The addressing inputs of the integrated circuit, i.e., the external signal inputs $A_1, A_2, \ldots A_m$ also address the test decoder TDE since an activation of the test decoder TDE and inactivation of the address decoder ADE may occur in view of the aspects to be observed according to the invention.

This state can be achieved due to a control signal X1 fed-in through an external terminal which is not counted among the address inputs, or through a control signal X2 which is generated by a circuit part USS for a given signal combination at the signal inputs $B_1, B_2, \ldots B_n$. Due to the addressing signals obtained through the addressing inputs $A_1, A_2, \ldots A_m$, the test decoder TDE then switches critical points of the integrated circuit or test circuits especially provided for control purposes, on the semiconductor chip containing the integrated circuit. As the name already indicates, the test circuits are circuit elements or circuit structures provided in the chip for test purposes only. The circuit parts which can be addressed or controlled from the test decoder TDE are designated in FIG. 1 with reference symbols $TE_1, TE_2, \ldots TE_s$.

The control signals $B_1, B_2, \ldots B_n$ and the addressing signals $A_1, A_2, \ldots A_m$ address the respectively driven address buffer $BU_1, \ldots BU_m$ and the memory matrix SPM in the usual manner during the normal operation of the integrated circuit illustrated in FIG. 1. The control signals which are to be fed to the rows and columns driven through the addressing operation are generated through the address decoder ADE from combinations of the address bits fed-in through the individual external addressing inputs $A_1, A_2, \ldots A_m$. In other words, the control signals are generated from the part of the address decoder ADE which is responsible for row-wise addressing and the part responsible for column-wise addressing, of the matrix SPM. The control signals enter the matrix SPM from the outputs 1. The test decoder TDE is taken out of operation during the normal operation of the overall system, through a connection 4 belonging to the switch-over system US.

The test decoder TDE may be activated by a switch-over control signal X2. This signal is generated in the circuit part USS addressed by the memory matrix SPM in the event of an addressing combination of the external control inputs $B_1, B_2, \ldots B_n$ which is especially provided for this purpose and does not occur during the normal operation of the memory. On the other hand, however, it is also possible to use a switch-over control signal X1 which can be fed in through an external input especially provided for the switch-over signal, for switching from normal operation to test operation. Provision is made in this case for ensuring that an activation of the test decoder TDE and a switching of the address decoder ADE connected to the test decoder TDE into the rest position, are only possible if the test decoder TDE is controlled by the signals X1 or X2 through the inputs 2.

Since the address inputs $A_1, A_2, \ldots A_m$ are also connected to the signal inputs of the test decoder TDE, it is possible to address circuit tests in a decoded manner, in test decoder operation. For instance, as already indicated, special test circuits $TE_1, TE_2, \ldots TE_s$, which are provided in the chip but are not used for normal operation of the integrated semiconductor circuit, can be activated through connections 7 leading from the test decoder TDE to the respective test circuits $TE_1, \ldots TE_s$. However, it is also possible for the test circuits $TE_1, \ldots TE_s$ to form part of the digital semiconductor circuit proper. The test results obtained at the signal outputs of the individual test circuits $TE_1, TE_2, \ldots TE_s$ leading back to the test decoder TDE are then made available at an external signal output Y of the test decoder TDE for further evaluation. This is due to the activation which is initiated and/or caused by the test decoder TDE (for instance, determination of cut-off voltages, determination of resistance values, etc.). On the other hand, an addressing of the entire memory can also be modified for test operation, for instance, through a connection 6 which leads from the test decoder TDE to the memory SPM proper. This can be done, for instance, for the purpose of controlling the execution control, or the reading signal measurement, etc.

As is well known, different circuit parts can be activated selectably by means of addresses, with a decoder on an MOS IC. A special test decoder TDE on the IC, which cannot select circuit parts in normal operation of the digital semiconductor circuit, is activated due to actuation of the switch-over part US by generating the signal X1 or X2 required therefor. The decoder therefore works like the other decoders provided in the circuit and responds to a special circuit which would never respond in the normal operation of the IC. Through the voltage applied to the test decoder, all other decoders which are provided in the circuit and are not to be used for testing purposes, become inactive, as already mentioned, so that their function in the circuit is disabled. This is made possible by a circuit part U addressed through a connection 3.

It has become possible by means of the test decoder TDE, to address redundant circuits specifically, or to switch on circuit variations, such as for measurements within the integrated digital semiconductor circuit. The circuit variations also include those which do not occur in the normal operation of the digital semiconductor circuit.

An important condition in a simple embodiment of the test decoder TDE is the use of a definite selection principle in the remaining decoders, i.e., the address decoders ADE, of the circuit. This is developed in such a way that for each external address $A_i$ a pair of signals, namely the signals $Ai_1$ and $Ai_2$, is generated internally. Depending on the address information A of the respective address input $A_i$ which corresponds either to the logical level "1" or to the logical level "0", only one of the two signals $Ai_1$ and $Ai_2$ has a positive voltage, while the other signal remains at the logical level "0", i.e., at a reference potential $V_{ss}$. The positive voltage always deactivates one half of the address decoders which are still provided on the IC, besides the test decoder TDE. In other words, each address signal fed to the address decoder ADE through an address input $A_i$ leads to two mutually inverted address signals, one of which corresponds to the logical level "1" used in the IC and the other of which corresponds to the logical level "0". However, only one of these signals is connected for internal addressing in a decoder ADE.

Figure 2:
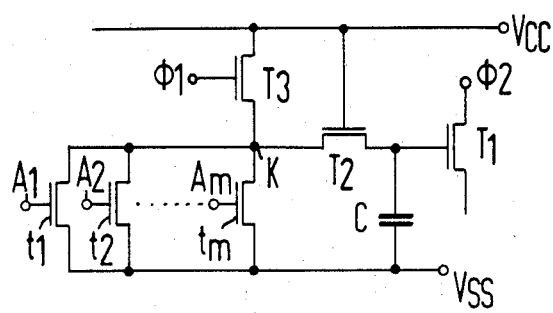
FIG. 2 is a schematic circuit diagram.

In this connection, reference is made to FIG. 2. FIG. 2 represents a conventional MOS circuit for an address decoder ADE which is constructed by means of self-locking MOS field-effect transistors $t_1, t_2, \ldots t_m$ having the same channel conduction or conductivity type (where m=number of address inputs $A_i$ and $i = 1, 2, \ldots m$), three further transistors $T_1, T_2, T_3$ which are likewise of the same type as the transistors $t_1$ to $t_m$, as well as a capacitor C. The source terminals of the MOS field-effect transistors $t_1, t_2, \ldots t_m$ assigned to the individual address inputs are connected to the reference potential $V_{ss}$ and the drain terminals thereof are connected to a common node K. The MOS field-effect transistor $T_3$ controlled by a precharging pulse $\phi_1$ of the memory, is connected between the node K and another supply potential $V_{cc}$. The gate of the MOS field-effect transistor $T_2$ is connected to the other supply potential $V_{cc}$ and the transistor $T_2$ is also connected from the node K on one hand through the capacitor C to the reference $V_{ss}$ and on the other hand to the gate of the MOS field-effect transistor $T_1$. The source of the transistor $T_1$ leads to a circuit part to be selected by the decoder ADE (in the memory matrix SPM according to FIG. 1 or another circuit part to be decoded out). The drain of the last-mentioned MOS field-effect transistor $T_1$ is addressed by pulses $\phi_2$ of a trigger clock. The MOS field-effect transistors used in the circuit are usually self-locking n-channel MOS FETs.

Figure 3:
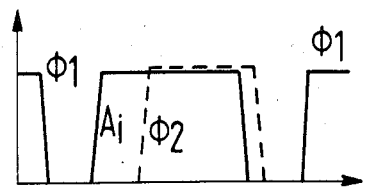
FIG. 3 is a graphical illustration, of embodiments for the test decoder and for the switch-over part of the device of FIG. 1.

FIG. 3 illustrates the waveform of the two operating clock pulses or signals $\phi_1$ and $\phi_2$ as well as the waveform of the individual addressing signals $A_i$ at the address input designated in the same manner. The precharging pulse $\phi_1$ precharges the node K to the other supply potential $V_{cc}$ at the start of each operating cycle. A discharge is possible within the individual operating cycle through the individual address transistors $t_i$, i.e., the transistors $t_1, t_2, \ldots t_m$. In this case, the signals $A_1$ to $A_m$ are signals of the above-mentioned type $A_{i1}$ and $A_{i2}$. If the decoder node K is not discharged, the trigger pulse $\phi_2$ is passed on by the transistor T1 and can address any other circuit part provided.

Figure 4:
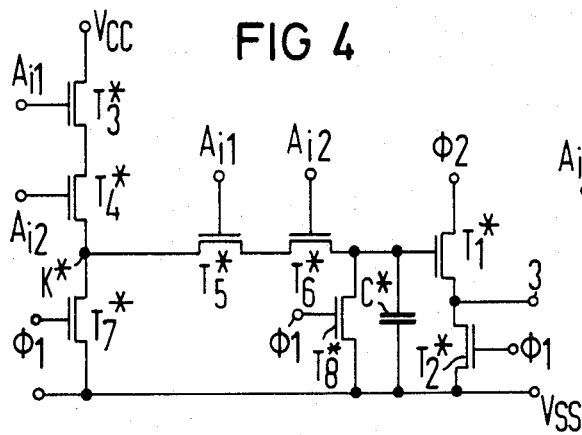
FIG. 4 is a circuit diagram of the test decoder TDE.

FIG. 4 shows an advantageous structure of the test decoder TDE which can be employed in the integrated circuit according to the invention. The test decoder TDE contains a capacitor C* and seven MOS FETs which are of the same type as the transistors in the address decoder ADE, i.e., particularly of the enhancement type. The transistor $T_1^*$ is addressed at the drain thereof by the trigger pulse $\phi_2$ and the source thereof is connected through the MOS field-effect transistor $T_2^*$, which is controlled by the precharging pulses $\phi_1$, to the reference potential $V_{ss}$. The output 3 of the test decoder is connected between the two MOS field-effect transistors $T_1^*$ and $T_2^*$. The gate of the transistor $T_1^*$ is also connected through the capacitor C* to the reference potential $V_{ss}$. The gate of the transistor $T_1^*$ is further connected through a series circuit formed of the two MOS field-effect transistors $T_5^*$ and $T_6^*$ to a node K*. The gate of the transistor $T_1^*$ is additionally connected through the MOS FET $T_8^*$, which is addressed by the precharging pulse $\phi_1$, to the reference potential $V_{ss}$. The control of the two transistors $T_5^*$ and $T_6^*$ forming the connection between the output transistor $T_1^*$ and the node K* will be discussed below. It should furthermore be said that the node K* is connected to the drain of an MOS field-effect transistor $T_7^*$, which is controlled by means of the precharging pulse $\phi_1$, and leads to the reference potential $V_{ss}$. The node K* is also connected to the source of a further field-effect transistor $T_4^*$. The field-effect transistor $T_4^*$ is connected through a further MOS field-effect transistor $T_3^*$ to the other supply potential $V_{cc}$.

With regard to the control of the transistor pairs $T_5^*$, $T_6^*$ and $T_3^*$, $T_4^*$ forming the connection of the node K* to the output transistor $T_1^*$ and to the other supply potential $V_{cc}$, the following can now be said: In both transistor pairs, one transistor is always controlled by the address signal $A_{i1}$ and the other transistor is controlled by the inverted signal $A_{i2}$. In the case of FIG. 4, the transistor $T_3^*$ which is farther away from the node K* in the connection from the node K* to the supply potential $V_{cc}$ is controlled by the addressing signal $A_{i1}$, and in the connection between the node K* and the output transistor $T_1^*$, the transistor $T_5^*$ directly connected to the node K* is controlled by the addressing signal $A_{i1}$. The other transistors $T_4^*$ and $T_6^*$ are controlled by the inverted addressing signal $A_{i2}$.

The following can now be said about the operation of the test decoder according to FIG. 4: If an external address $A_i$ is given, only the signal $A_{i1}$ or $A_{i2}$ is internally connected in the IC to positive voltage, due to an internal disconnection. Accordingly, one of the two transistors $T_3^*$ and $T_4^*$ is cut off on the path from the node K* to the supply potential $V_{cc}$. The same applies to the series circuit of the transistors $T_5^*$ and $T_6^*$ which lead from the node K* to the gate of the output transistor $T_1^*$. In order to prevent charging of the node K* over several cycles, the transistor $T_7^*$ is provided. As already stated, the transistor $T_7^*$ is also controlled by the precharging pulse $\phi_1$. In addition, the two transistors $T_5^*$ and $T_6^*$ in the connection from the node K* to the gate of the output transistor $T_1^*$ are addressed in the opposite order, as compared to the transistors $T_3^*$ and $T_4^*$. Furthermore, the possibly charged up gate of the output transistor $T_1^*$ is discharged by the precharging pulse $\phi_1$ through the MOS field-effect transistor $T_8^*$ shunted across the capacitor C*.

As already mentioned, the output 3 of the test decoder according to FIG. 4 is represented by the source terminal of the transistor $T_1^*$ and the drain terminal of the transistor $T_2^*$ leading to the reference potential $V_{ss}$. The transistor $T_2^*$ serves the purpose of pulling the output 3 of the test decoder to the reference potential $V_{ss}$ during the precharging phase with the precharging pulse $\phi_1$. In normal operation, the trigger pulse $\phi_2$ present at the drain of the output transistor $T_1^*$ is therefore never connected through. This is only made possible by the circuit part of the test decoder TDE shown in FIG. 5.

This further circuit part contains a series circuit of two MOS field-effect transistors $T_9^*$ and $T_{10}^*$. The series circuit is acted upon at one terminal thereof by the addressing signal $A_{i1}$ and at the other terminal thereof by the addressing signal $A_{i2}$, which is inverted relative to the addressing signal $A_{i1}$. The divider point between the two transistors $T_9^*$ and $T_{10}^*$ is connected to the gates of the two transistors $T_9^*$ and $T_{10}^*$. The divider point is furthermore connected on one hand to a terminal 2 (also see the terminal 2 provided in FIG. 1 at the test decoder TDE) and on the other hand the divider point is connected through the drain-source path of a further MOS field-effect transistor $T_{11}^*$ to reference potential $V_{ss}$. The last-mentioned transistor $T_{11}^*$ is controlled at the gate thereof by the precharging pulse $\phi_1$.

Figure 5:
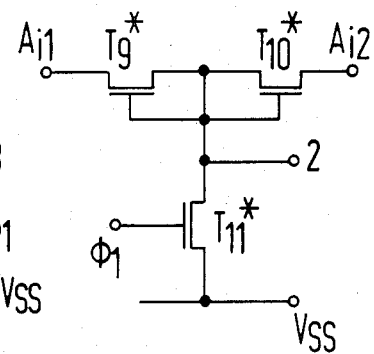
FIG. 5 is a circuit diagram of a different test decoder TDE having fewer components.

A positive voltage can be applied to the terminal 2 in the circuit part of the test decoder TDE shown in FIG. 5. According to FIG. 1, this voltage at the terminal 2 is furnished by the switch-over signal X1 or X2. The two transistors $T_9^*$ and $T_{10}^*$ are switched into conduction, so that the exclusion behavior between the signals $A_{i1}$ and $A_{i2}$ is cancelled. The impressed voltage at the terminal 2 supplies the two addressing signals $A_{i1}$ and $A_{i2}$ with positive potential. In this way, the output transistor $T_1^*$ in the test decoder TDE is turned up, so that the trigger pulse $\phi_2$ can address a test circuit (for instance, the circuit TE$_1$ in FIG. 1) through the output 3. At the same time, address decoders (which are likewise addressed by the addressing signals $A_{i1}$ and $A_{i2}$) of the kind seen in FIG. 2 are inactive, so that their nodes K are discharged by the transistors $t_1, t_2, \ldots t_m$. In the addressed test circuit (addressed by the test decoder TDE), for addressing modifications, addresses $A_j$ can even be used which are not equal to the addresses $A_{i1}$ and $A_{i2}$ and which are derived from the decoders. This is possible since their circuit function cannot influence the switching of the test decoder in testing operation.

The transistors $T_1$ through $T_3$ and t, can be referred to as first through fourth transistors and therefore the transistors $T_1^*$ through $T_{11}^*$ can be referred to as fifth through fifteenth transistors.

The control of the test circuits seen in FIG. 1, with a test decoder according to FIG. 4, is thus understood.

Regarding the delivery of the results furnished by the respectively addressed test circuits $TE_1$, $TE_2$ to the output Y as seen from FIG. 1, it can be said that a non-illustrated transfer transistor may be provided for this purpose between the individual test circuit $TE_1$, $TE_2$ etc. and the output terminal Y. The gate of the transfer transistor is controlled by the output 3 of the test decoder TDE according to FIG. 4.

Figure 7:
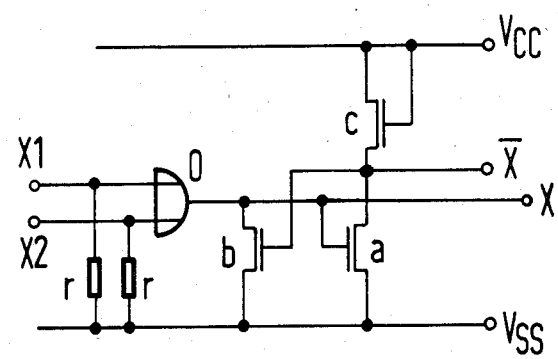
FIG. 7 is a circuit diagram of a circuit for producing the signals x and x.

The switch-over process using a signal X1 or X2 between the test decoder TDE and the address decoder ADE can be accomplished, however, in a manner which is simpler than that which is described with the aid of FIGS. 4 and 5. In this case, the test decoder TDE and the address decoder can be identically constructed circuit-wise, for instance, in accordance with FIG. 2. The use of one additional transistor $t_i$ with a gate connection X in all decoders ADE (having a drain connected to the node K and a source connected to the reference potential $V_{ss}$) would be sufficient. FIG. 7 shows one possibility for generating the signals X and $\overline{X}$ for this embodiment.

Figure 8:
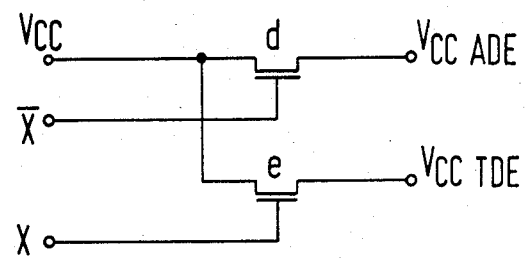
FIG. 8 is a circuit diagram for a circuit for producing the supply potential $V_{cc}$.

A third switch-over form can be provided by means of special circuits U and US for the circuit according to FIG. 1. In principle, a supply voltage of address decoders ADE or test decoders TDE (which are circuit-wise equal to the address decoders ADE) is alternatively switched on. FIGS. 8 and 7 show a principle suitable for this purpose.

In the circuit according to FIG. 7 MOS field-effect transistors of the same type are used, which also correspond to the field-effect transistors in the decoder proper according to FIG. 2. In the circuit according to FIG. 7, the terminals provided with the switch-over signals X1 and X2 explained with the aid of FIG. 1, are each connected to an input of an OR gate O. The output of the OR gate O is applied to the gate of a first MOS field-effect transistor a and to the drain of a second MOS field-effect transistor b. The drain of the first field-effect transistor a is furthermore connected to the gate of the second field-effect transistor b. In addition, the first field-effect transistor a forms an inverter with a third MOS field-effect transistor c connected as a load to the other supply potential $V_{cc}$. Meanwhile, the first and second transistors a and b together perform the function of an RS flip-flop. The output of the OR gate O supplies a signal X and the output of the above-mentioned inverter supplies a signal $\overline{X}$, which is inverted relative to the signal X.

As may be seen from FIG. 8, the terminal furnishing the other supply potential $V_{cc}$ for the decoders ADE and TDE is connected through two further MOS field-effect transistors d and e, each being grouped to the supply inputs of the addressing decoders ADE on one hand and each being grouped to the test decoder(s) provided in the circuit on the other hand. The connection to the address decoders ADE is controlled by the inverted output signal $\overline{X}$ supplied by the circuit according to FIG. 7, and the connection to the test decoder TDE is controlled by the non-inverted output signal X.

The circuit section USS which is also contained in FIG. 1 and furnishes the switching signal X2, contains logic gates which set a flip-flop, for instance, for a combination of the pulses $B_1$ to $B_n$ which does not occur in normal operation. The flip-flop furnishes a signal voltage to X2, or alternatively to X1. A repeated occurrence of this signal combination resets the RS flip-flop which is formed of the two transistors a and b. A simple structure would be, for instance, an AND gate with the inputs $B_1$ and $B_2$, if the signals $B_1$ and $B_2$ could never occur simultaneously in normal operation of the semiconductor circuit.

It should furthermore be mentioned in connection with FIGS. 1 and 2 that in an embodiment of the address decoder ADE in the manner seen in FIG. 2, the address decoder is formed of several circuit parts corresponding to FIG. 2. The source terminal of the output transistor $T_1$ provided in each respective circuit, is then connected by a line 1 to the matrix SPM of the memory circuit according to FIG. 1.

Figure 6:
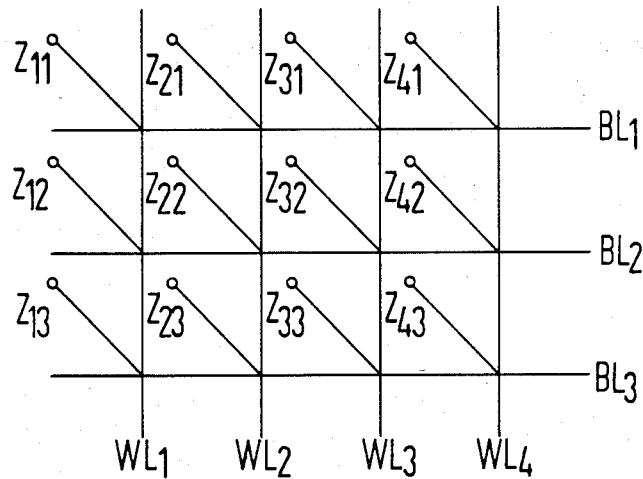
FIG. 6 is a schematic circuit diagram of a dynamic memory matrix.

FIG. 6 is a schematic circuit diagram for a dynamic memory matrix which, in the case of the illustrated embodiment, is controlled by four word lines $WL_1$, $WL_2$, $WL_3$ and $WL_4$ and three bit lines $BL_1$, $BL_2$ and $BL_3$. The location of the individual memory cells $Z_{rs}$ is indicated by two indices, wherein the first index r gives the number of the respectively assigned word line and the second index x gives the number of the respectively corresponding bit line.

As is well known, the memory cells $Z_{rs}$ as well as the read signal in dynamic MOS RAM memories belong to the critical points which enter into the function for the operation of the memory in a decisive manner. However, they also play a part in the operation of the test decoder TDE. As will be seen from FIG. 6, the individual memory cells $Z_{rs}$ are always located at the crossing of the $r^{th}$ word line $WL_r$ associated with it and the bit line $BL_s$ associated with it. If one of these word lines $WL_1$, $WL_2$ etc. is addressed, then all cells of the addressed word line are connected to the corresponding bit line $BL_1$, $BL_2$, etc. The information stored as charges in the individual cells $Z_{rs}$ are therefore read out through the corresponding bit line. After subsequent evaluation (comparison with a reference signal and subsequent amplification) the information read out in this manner is processed further. All memory cells $Z_{rs}$ are normally constructed and laid out in the same manner as far as possible.

A cell testing circuit which can respond for the test decoder TDE can be formed of a word line or a bit line. The corresponding cells of the line have a deviation as compared to the memory cells $Z_{rs}$ provided for the normal operation of the memory device. This deviation may be in the layout of the size of the storage capacity, for instance. By selecting a word line or a bit line having memory cells which deviate from the normal memory cells, in a manner corresponding to normal memory operation, obviously each of the cells with different properties can be addressed. The selection of such a cell test line provided with different memory cells can be accomplished by means of the test decoder, while the normal storage cells are available only through the address decoder ADE. Important data can be obtained by means of such a cell testing circuit, especially in view of the operation of the integrated circuit in dependence on the charged property of the memory cells. If this changed property is the dimension of the memory cell, a coordination of the increase of the readout signal relative to the area increase is obtained. A further possibility is to determine the optimum ratio of the dimensions of the memory cell to the corresponding dimensions of the dummy cell (reference cell) more accurately than with fomer methods, by means of such testing methods which are made possible by the test decoder. However, the same also applies for instance, to the determination of the minimum required cell size change for compensating changes in the technology which may have to be applied in the production during the manufacture of the memories.

It is understood that a structure according to the invention may also be advantageous in other integrated digital semiconductor circuits which are provided with a decoder addressed by external addressing signals. It is furthermore possible, without difficulty, to construct the address decoder as well as the test decoder in a manner other than by using single-channel MOS technology, such as in bipolar technology or in CMOS technology.

With regard to generating the complementary addressing signals such as are required, among other things, in the layout of the test decoder according to FIGS. 4 and 5, reference can be made to the book "Hochintegrierte MOS-Schaltungen" (Large-scale integrated MOS circuits) (1972) by Dietrich Becker and Heinz Mäder (see pages 94 to 96).

The foregoing is a description corresponding in substance to German application P No. 32 32 215.1, dated Aug. 30, 1982, the International priority of which is being claimed in the instant application, and which is hereby made part of this application. Any material discrepancies between the foregoing specification and the aforementioned corresponding German application are to be resolved in favor of the latter.

I claim:

1. Monolithically integrated digital semiconductor circuit, comprising an address decoder, first means connected to said address decoder for supplying external addressing signals thereto, a test decoder connected to said address decoder and connected to said external addressing signal supply means for directly receiving at least part of said external addressing signals, second means being connected to and controlled by said test decoder, a switching circuit being responsive to a specific switchover signal, operatively connected to the address decoder and to said test decoder for causing said test decoder to be activated and causing said address decoder to be placed in a rest condition.

2. Semiconductor circuit according to claim 1, in combination with a test circuit monolithically combined with the semiconductor circuit, wherein said second means are part of said test circuit.

3. Semiconductor circuit according to claim 1, including an external terminal for feeding in said switchover signal.

4. Semiconductor circuit according to claim 1, comprising signal inputs being connected to said switching circuit for supplying a specific combination of digital input signals causing said switching circuit to generate said switch-over signal.

5. Semiconductor circuit according to claim 1, including a supply voltage source, said test decoder and address decoder being formed of identical circuits, and said switching circuit being in the form of third means for disconnecting said address decoder from said supply voltage source when said switching circuit is activated and for simultaneously connecting said test decoder to said supply voltage source.

6. Semiconductor circuit according to claim 1, wherein said address decoder is automatically deactivated when said test decoder is activated.

7. Semiconductor circuit according to claim 1, wherein said test decoder and address decoder include self-blocking MOS field-effect transistors.

8. Semiconductor circuit according to claim 7, wherein said transistors are of the same channel type.

9. Semiconductor circuit according to claim 1, including a pre-charging pulse source, a trigger pulse source, a reference potential source and a supply potential source, said external addressing signal supply means comprising a plurality of address inputs, said address decoder comprising a plurality of identical circuit sections, and wherein each of said circuit sections includes a common node, first, second, third and fourth self-blocking MOS field-effect transistors, said fourth trannsistor having a gate terminal connected to one of said address inputs, a source terminal connected to said reference potential source and a drain terminal connected to said common node, said third transistor being connected between said common node and said supply potential source and having a gate terminal connected to said precharging pulse source, said second transistor being connected between said common node and the gate terminal of said first transistor and having a gate terminal connected to said supply potential source, said first transistor having a drain terminal connected to said trigger pulse source and a source terminal forming a signal output of said address decoder, and a capacitor connected between the gate terminal of said first transistor and said reference potential source.

10. Semiconductor circuit according to claim 9, further comprising a plurality of inverters each being connected to a respective one of said address inputs for generating a signal at an inverted address input which is inverted relative to said addressing signal.

11. Semiconductor circuit according to claim 10, wherein said test decoder comprises a circuit node, fifth through twelfth self-blocking MOS field-effect transistors, said fifth transistor having a source terminal and said sixth transistor having a drain terminal together forming an output of said test decoder connected to said address decoder, said fifth transistor having a drain terminal connected to said trigger pulse source, said sixth transistor having a gate terminal connected to said precharging pulse source and a source terminal connected to said reference potential source, and a capacitor connected between the gate terminal of said fifth transistor and said reference potential source, said twelfth transistor being connected between the gate terminal of said fifth transistor and said reference potential source and having a gate terminal connected to said precharging pulse source, said ninth and tenth transistors being connected together in series as a first pair of transistors connected between the gate terminal of said first transistor and said circuit node, said eleventh transistor being connected between said circuit node and said reference potential source and haivng a gate terminal connected to said precharging pulse source, said seventh and eighth transistors being connected together in series as a second pair of transistors connected between said circuit node and said supply potential source, the gate terminal of one of said transistors of each pair being connected to one of said address inputs and the gate terminal of the other of said transistors of each pair bein connected to said inverted address input delivering a signal inverted relative to said one address input.

12. Semiconductor circuit according to claim 11, wherein said ninth transistor of said first pair is directly connected to said circuit node and the gate terminal thereof is connected to said one address input, and said eighth transistor of said second pair is directly connected to said circuit node and the gate thereof is connected to said inverted address input.

13. Semiconductor circuit according to claim 11, wherein said test decoder includes a further part having thirteenth, fourteenth and fifteenth self-blocking MOS field-effect transistors, said thirteenth and fourteenth transistors having source-drain paths being connected together in series at a junction point, having gate terminals being connected to said junction point and having other terminals, said fifteenth transistor being connected between said junction point and said reference potential source and having a gate terminal connected to said precharging pulse source, said switch-over section being directly connected to said fifteenth transistor for supplying said switch-over signal thereto, and said other terminals each being connected to a respective one of said address input and inverted address input.

14. Semiconductor circuit according to claim 1, wherein said second means are test circuit parts, and said test decoder includes individual outputs for controlling activation of said test circuit parts.

15. Semiconductor circuit according to claim 14, wherein said test decoder comprises a common external test output, and said test circuit parts include signal outputs, and including transfer transistors each being connected between a respective one of said signal outputs of said test circuit parts and said common external test output and each having a gate terminal connected to a respective one of individual outputs of said test decoder.

16. Semiconductor circuit according to claim 1, wherein said circuit further comprises an addressable memory matrix having normal memory cells for normal operation thereof, and includes additional memory cells being exclusively addressable by said test decoder, said additional memory cells being different from said normal memory cells.

17. Semiconductor circuit according to claim 16, wherein said additional memory cells have structural dimensions that are different from said normal memory cells.

18. Semiconductor circuit according to claim 1, including third means for selectively activating said address decoder or said test decoder.

* * * * *